(12) United States Patent
Ware

(10) Patent No.: US 9,304,530 B1
(45) Date of Patent: Apr. 5, 2016

(54) SKEW-TOLERANT STROBE-TO-CLOCK DOMAIN CROSSING

(71) Applicant: Rambus Inc., Sunnyvale, CA (US)

(72) Inventor: Frederick A. Ware, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 326 days.

(21) Appl. No.: 13/946,864

(22) Filed: Jul. 19, 2013

Related U.S. Application Data

(60) Provisional application No. 61/693,925, filed on Aug. 28, 2012.

(51) Int. Cl.
| | | |
|---|---|---|
| *G06F 1/04* | (2006.01) | |
| *G06F 1/08* | (2006.01) | |
| *G11C 7/22* | (2006.01) | |

(52) U.S. Cl.
CPC .. *G06F 1/04* (2013.01); *G06F 1/08* (2013.01); *G11C 7/22* (2013.01)

(58) Field of Classification Search
CPC .............. G06F 1/04; G06F 1/10; G11C 7/22; G11C 7/222
USPC ......................... 713/500, 503, 600; 365/233.1
See application file for complete search history.

(56) References Cited

U.S. PATENT DOCUMENTS

| | | | |
|---|---|---|---|
| 6,209,072 B1 * | 3/2001 | MacWilliams et al. ........ | 711/167 |
| 7,042,799 B2 | 5/2006 | Cho | |
| 7,487,379 B2 * | 2/2009 | Nguyen et al. ................ | 713/600 |
| 7,529,960 B2 * | 5/2009 | Park et al. ..................... | 713/500 |
| 7,543,172 B2 * | 6/2009 | Kizer et al. ................... | 713/401 |
| 7,688,672 B2 * | 3/2010 | Best et al. .................. | 365/233.1 |
| 7,746,723 B2 | 6/2010 | Oh et al. | |
| 7,787,310 B2 * | 8/2010 | Johnson .................. | 365/189.02 |
| 7,975,162 B2 | 7/2011 | Kim et al. | |
| 8,264,907 B2 * | 9/2012 | Truong et al. ............ | 365/233.13 |
| 8,886,987 B2 * | 11/2014 | Rivoir .......................... | 713/500 |
| 2007/0201286 A1 * | 8/2007 | Oh ................................ | 365/193 |
| 2010/0208534 A1 | 8/2010 | Fujisawa | |
| 2011/0158010 A1 | 6/2011 | Lee | |
| 2014/0029331 A1 * | 1/2014 | Gopalakrishnan et al. ... | 365/149 |

* cited by examiner

*Primary Examiner* — Chun Cao
(74) *Attorney, Agent, or Firm* — Charles Shemwell

(57) ABSTRACT

A strobed signaling interface generates a reduced-frequency replica of an incoming strobe signal and applies the replica to extend the interval over which strobe-sampled write data values remain available for transfer to a clocked timing domain. Quadrature instances of the reduced-frequency strobe replicas may be generated and occasionally sampled by skew control logic within the memory component to obtain a coarse measure of the skew between the strobed and clocked timing domains. When the strobe-to-clock domain skew is outside a predetermined boundary, the skew control logic selects an alternative clock signal edge (i.e., earlier or later edge) to sample strobed data, thereby reducing the effective skew between the two timing domains.

20 Claims, 11 Drawing Sheets

SKEW-TOLERANT STROBE-TO-CLOCK DOMAIN CROSSING

TECHNICAL FIELD

The present disclosure relates generally to the field of electronic communications and more particularly to signaling between integrated circuit components.

BACKGROUND

Synchronous memory systems often include separately timed command and data signaling paths that establish correspondingly separate timing domains in recipient components. More specifically, high-speed data signals are typically sampled within the data interface of a memory component in response to non-periodic strobe signals, while lower-speed command/address signals are sampled within the memory component's command interface in response to transitions of a controller-forwarded clock signal. The clock signal generally serves as the primary timing reference for access and control operations with respect to the memory core so that strobe-sampled write data signals must cross from a strobe-established timing domain to the clock-controlled timing domain of the memory core interface.

To avoid domain-crossing error, skew between the clock and strobe timing domains has historically been limited by PLL-controlled phasing of the memory component's internal clock domain. In more modern designs, power-hungry PLLs (phase-locked loops) are omitted and skew is managed instead through trace-length matching of clock and strobe signaling lines. Unfortunately, trace length matching fails to account for internal signal paths, the lengths of which tend to be increasingly disparate as packaging technologies evolve. For example, in emerging edge-bonded memory components, an incoming clock signal may traverse the entire width of the chip to reach the site of the strobe-to-clock domain crossing. The resulting timing skew shrinks domain-crossing margins and thus, effectively limits top-end signaling rate.

BRIEF DESCRIPTION OF THE DRAWINGS

The various embodiments disclosed herein are illustrated by way of example, and not by way of limitation, in the figures of the accompanying drawings and in which like reference numerals refer to similar elements and in which.

DETAILED DESCRIPTION

A skew-tolerant strobed signaling interface is disclosed in various embodiments. In one such embodiment, the strobed signaling interface generates a reduced-frequency replica of an incoming strobe signal and applies the replica to extend the interval over which strobe-sampled write data values remain available for transfer to a clocked timing domain. In a number of implementations, for example, the reduced-frequency strobe replica is a half-rate version of the incoming strobe signal and is used, in conjunction with the strobe signal itself and a doubled internal data path width, to double the interval over which strobe-sampled write data values are available for transfer to the clocked timing domain. By this operation, the tolerable skew between the strobed and clocked timing domains may be significantly increased. For example, in a double-data rate memory system in which a data bit or multi-bit symbol remains valid at the input of a memory component for half a clock cycle (i.e., two data bits or symbols are transmitted per signal line per clock cycle, $T_{CK}$, so that the unit interval or bit-time is $0.5T_{CK}$), doubling the data-valid interval at the strobe-to-clock domain crossing increases the skew tolerance from just under $0.5T_{CK}$ to just under $2.0T_{CK}$ (i.e., 400%), thus gaining more than a complete clock cycle of additional tolerance. In another embodiment, quadrature instances of the reduced-frequency strobe replicas are generated and occasionally sampled by skew control logic within the memory component to obtain a code that serves as a coarse measure of the skew between the strobed and clocked timing domains. When the skew code indicates that the strobe-to-clock domain skew is outside a predetermined boundary, the skew control logic selects an alternative clock signal edge (i.e., earlier or later edge) to sample strobed data, thereby reducing the effective skew between the two timing domains and enabling effectively unlimited skew range. These and other embodiments, features and benefits are described in greater detail below.

Figure 1:
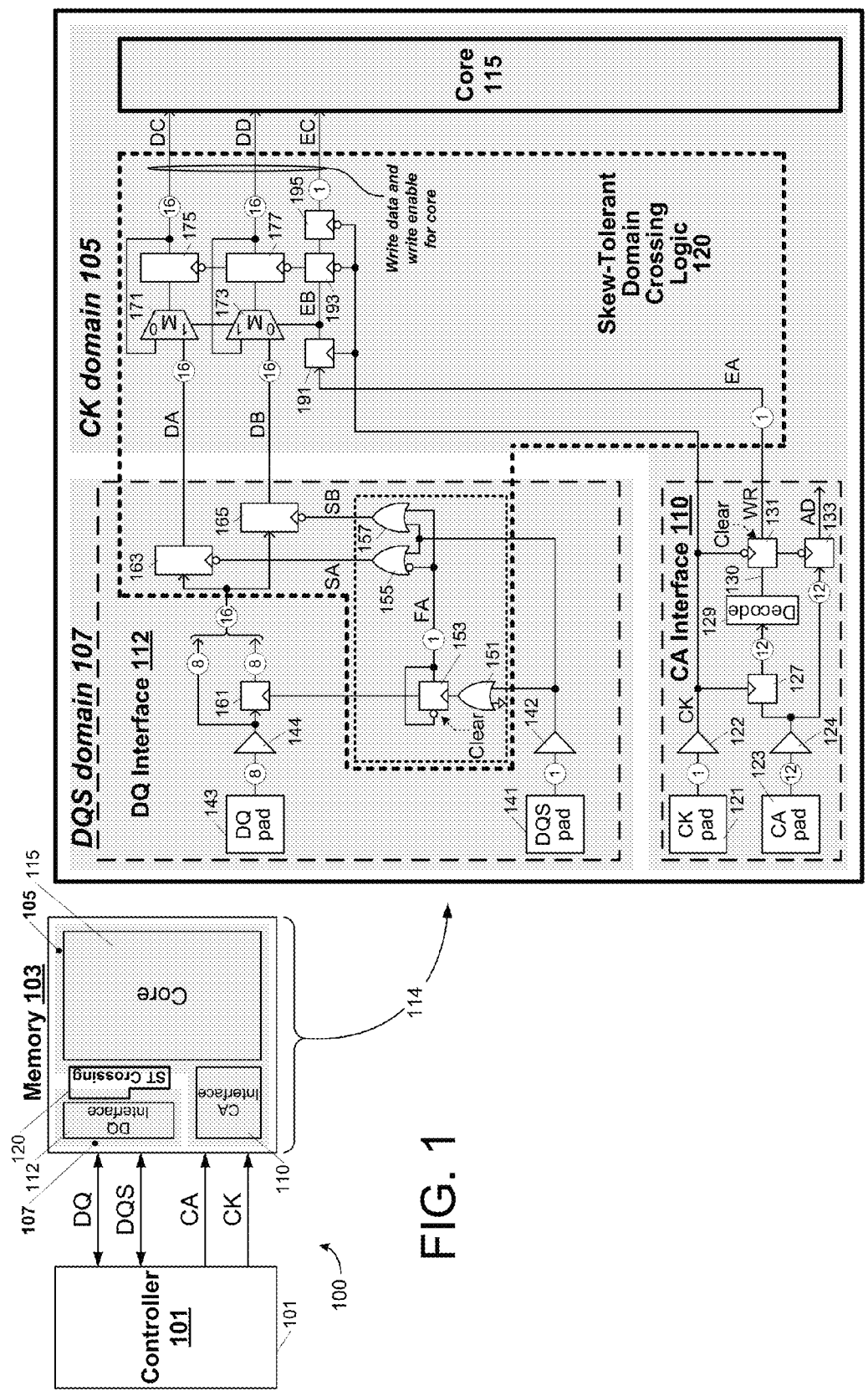
FIG. 1 illustrates an embodiment of a low-power memory system 100 having a control component 101 and a skew-tolerant memory component 103 interconnected by data, data strobe, command/address and clock signaling links.

FIG. 1 illustrates an embodiment of a low-power memory system 100 having a control component 101 and a skew-tolerant memory component 103 interconnected by data (DQ), data strobe (DQS), command/address (CA) and clock (CK) signaling links. Although a single memory component is shown, multiple memory components 103 may be provided in alternative embodiments or configurations (e.g., to scale the data bandwidth and storage capacity of the memory system), with a number of the memory components coupled in common to the command/address and clock links, but coupled to control component 101 via respective sets of data and data strobe links. The different loading and routing arrangements of the clock and data strobe links generally result in skewed arrival of clock and strobe signals at memory component 103, and thus skewed clock and strobe timing domains within the command/address interface 110 and data interface 112 of the memory component. As discussed above, even where external trace lengths are equalized (e.g., CK and DQS routed to achieve simultaneous signal arrival at memory component 103), internal routing requirements may yield skew between the clocked and strobed timing domains.

Though not specifically shown, the clock signal received via command/address interface 110 is forwarded to memory core 115 (e.g., core storage array and structures for accessing and maintaining the array) and thus forms the operating clock domain shown by the shaded region 105, while incoming data signals are latched in the strobe domain of the data interface 112, shown by shaded region 107. Skew-tolerant domain crossing logic 120 is provided to bridge these two timing domains in a manner that permits substantially more domain skew than conventional designs without appreciably increased power consumption (i.e., no phase-locked loop (PLL) or delay-locked loop (DLL)), thus enabling external and internal signal path routing constraints to be relaxed.

Referring to detail view 114 of memory component 103, command interface 110 includes clock and command/address pads (121 and 123) to be coupled to counterpart clock and command/address signaling links, and data interface 112 similarly includes strobe and data pads (141 and 143) to be coupled to counterpart strobe and data signaling links. Each pad shown in the data and command/address interfaces may in fact include multiple pads, as necessary to implement an n-bit wide data interface and m-bit wide command interface. In the particular example shown, which is carried forward in other exemplary embodiments described below, a byte-wide, single-strobe data interface (i.e., eight single-ended or differential data signaling links accompanied by a strobe link) and a 12-bit wide clocked command/address interface are assumed, though narrower or wider data interfaces (including multiple-byte data interfaces, in which each byte or other data link subset is accompanied a respective strobe signal) and/or narrower or wider command/address interfaces may be provided in alternative embodiments. Also, double-rate data and command signaling (two bits per signaling link per clock cycle, $T_{CK}$) are implemented in the depicted embodiment, though more or fewer data bits and/or command/address bits may be transferred per clock cycle in alternative embodiments.

Referring first to command/address interface 110, an initial "command" portion of a command/address value arriving via pad 123 is conditioned (e.g., amplified, buffered and/or converted to a logic signal level) within receiver 124 and captured within register 127 (i.e., sampled) in response to a rising edge of the incoming clock signal, itself arriving via pad 121 and conditioned within receiver 122. The sampled command value is output to decoder 129, which in turn generates a number of operation-enable signals according to the commanded operation. In the case of a write operation, for example, decoder 129 asserts an enable signal on line 130 to be captured, in response to the ensuing falling edge of the clock signal, within register 131 and output therefrom as a write-enable signal, "WR." In the case of other commands (e.g., read, refresh, register-write, etc.), the decoder may output other control signals to be latched in respective control elements and (not specifically shown) and delivered to logic within memory core 115.

The same falling clock edge that latches the decoder output (e.g., latching a write-enable signal within register 131) latches an "address" portion of the command/address value within address register 133, thereby delivering the address value (along with any supplemental address bits that may have been captured in or generated based on the command portion of the command/address value) to memory core 115 for application in the commanded operation.

Turning to data interface 112, an incoming strobe signal (DQS), received via pad 141 and conditioned in receiver 142, is supplied via delay element 151 to a toggle flop 153, thereby generating a reduced-frequency replica of the strobe signal, FA. In the implementation shown, the toggle flop is cleared (e.g., in response to assertion of a "Clear" signal) at device start-up so that the first rising edge of the strobe signal, corresponding to the first incoming byte of a multi-byte data value, drives the replica signal high and a subsequent rising edge of the strobe signal drives the replica signal low, thus producing a frequency-divided (i.e., half-rate) version of the strobe signal. The replica signal, FA, is ANDed with the strobe signal in gates 155 and 157 (which may be viewed as NAND gates with complement inputs), to generate odd word-strobe and even word-strobe signals, SA and SB, which, as explained below, are applied to strobe respective pairs of incoming data bytes into registers 163 and 165.

In one embodiment, toggle flop 153 is cleared in response to assertion of a "Clear" signal at device start-up, a signal which may also be used to initialize other logic within signaling interfaces 110 and 112, domain crossing logic 120 and/or other logic within memory component 103. In one implementation, for example, the Clear signal is pulsed when a "Clear" command is received and decoded within decoder 129. The clear pulse, which causes toggle flop 153 to clear asynchronously (i.e., without the DQS signal being pulsed), may be issued during an interval in which the DQS signal is dormant (i.e., not transitioning) to ensure that toggle flop 153 is in the proper state at the beginning of a write operation and associated write data burst. The clear command may be issued by controller component 101 only once when memory system 100 is initialized, or may also be issued when the system is not performing read or write operations, for example, during an idle period or during a core refresh operation. Also, the Clear signal may alternatively (or additionally) be pulsed by control logic within memory component 103, for example, in response to detecting a power-up event, reset event, receipt of a refresh or other maintenance command from controller component 101, or any other event indicating an opportunity or motivation for clearing toggle flop 153 and/or other logic within memory component 103. These various approaches to pulsing the Clear signal may be applied in any of the embodiments disclosed herein.

Still referring to data interface 112, an initial byte (D0) of a four-byte write data value arriving via DQ pad(s) 143 is conditioned within receiver 144 and then captured within (i.e., sampled by) register 161 in response to a rising edge of the strobe signal from delay element 151. The second of the four incoming write-data bytes (D1) is output by receiver 144 while the replica signal is high, so that, as the strobe signal goes low, a falling-edge transition of even word-strobe signal, SA, is generated by NAND gate 155 to capture the first and second bytes (D0/D1—the even data word, "DA") within register 163. The next two bytes of the four-byte write data value (D2 and D3) are sampled in the generally same manner as the first, except that the last of the incoming four bytes (D3) is output by receiver 144 while the replica signal is low so that, as the strobe signal goes low, a falling edge transition of odd word-strobe signal, SB, is generated to capture the third and fourth write data bytes (D2/D3—the odd-data word, "DB") within register 165.

Still referring to detail view 120 of FIG. 1, the 16-bit outputs of strobe-domain registers 163 and 165 are supplied to counterpart clock-domain registers 175 and 177 via load multiplexers 171 and 173. The multiplexers are controlled by a synchronously delayed write-enable pulse, EB, timed to go high in response to a rising clock signal edge that occurs at the nominal center of the DA valid interval (i.e., nominal center between the active-low assertion of successive SA signals) and then low during the subsequent clock signal edge that occurs at the nominal center of the DB valid interval (i.e., nominal center between active-low assertion of successive SB signals). By this operation, a strobe-to-clock timing domain crossing is effected with write data bytes D0/D1 (i.e., DA) loaded into register 175 in response to the falling clock edge that occurs in the middle of the EB pulse, and write data bytes D2/D3 (i.e., DB) loaded into register 177 one clock cycle later, at the falling clock edge that occurs after the EB signal goes low. The delayed write-enable pulse, EB, is loaded into register 193 in response to the same falling clock edge that loads D0/D1 into clock domain register 175, and then into register 195 in response to the subsequent falling clock edge that loads D2/D3 into clock domain register 177, thereby asserting a write-enable signal, "EC," at memory core 115 to signal the valid write data at the outputs of registers 175 and 177 (i.e., write data bytes D0/D1 and D2/D3, shown as even and odd clock-domain data words, "DC" and "DD," respectively).

FIGS. 2-5 present exemplary timing diagrams of the operation of the signal reception and domain crossing operations described in reference to FIG. 1 as the skew between the strobe and clock timing domains shifts. In each timing diagram, the strobe domain and clock domain signals are separated by dividing line 200, with the strobe domain signals presented above the dividing line and the clock domain signals presented below. Further, the clock domain signals remain unchanged in the four timing diagrams, and thus constitute a reference point for the drifting strobe domain. More specifically, in FIG. 2 the strobe domain is shown to lead the clock domain by three-quarters of a clock cycle (+0.75$T_{CK}$), and falls back in half clock-cycle increments to +0.25$T_{CK}$, −0.25$T_{CK}$ and −0.75$T_{CK}$ in FIGS. 3, 4 and 5, respectively. Despite the exemplary range shown, the skew tolerance achieved extends to ±0.99$T_{CK}$, thus expanding the skew tolerance range by 400% from just under 0.5 $T_{CK}$ to just under 2.0 $T_{CK}$.

Figure 2:
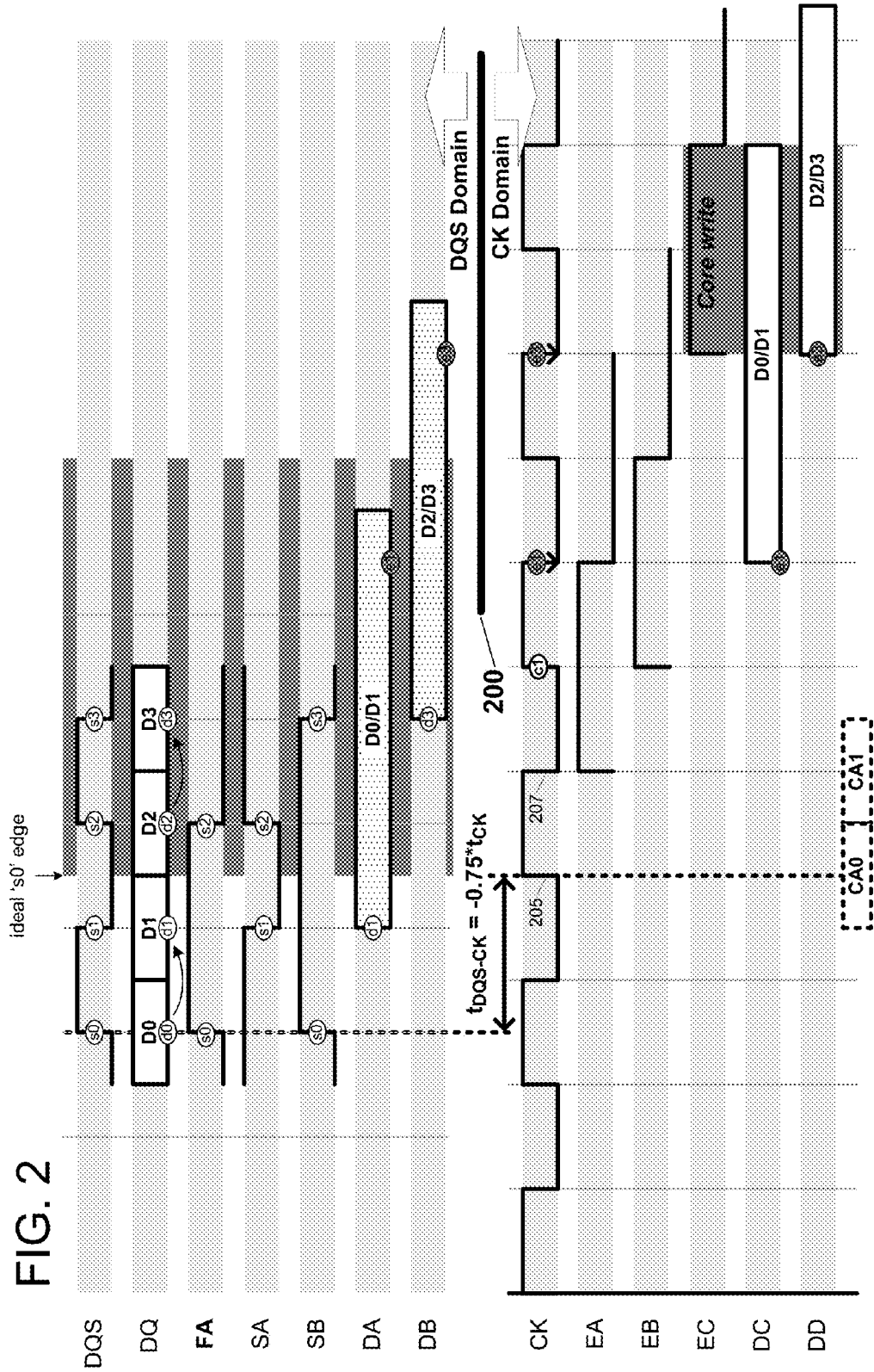
FIG. 2 is an exemplary timing diagram of the operation of the signal reception and domain crossing operations described in reference to FIG. 1 when the strobed clock domain leads the clocked timing domain by three quarters of a clock cycle.
Figure 3:
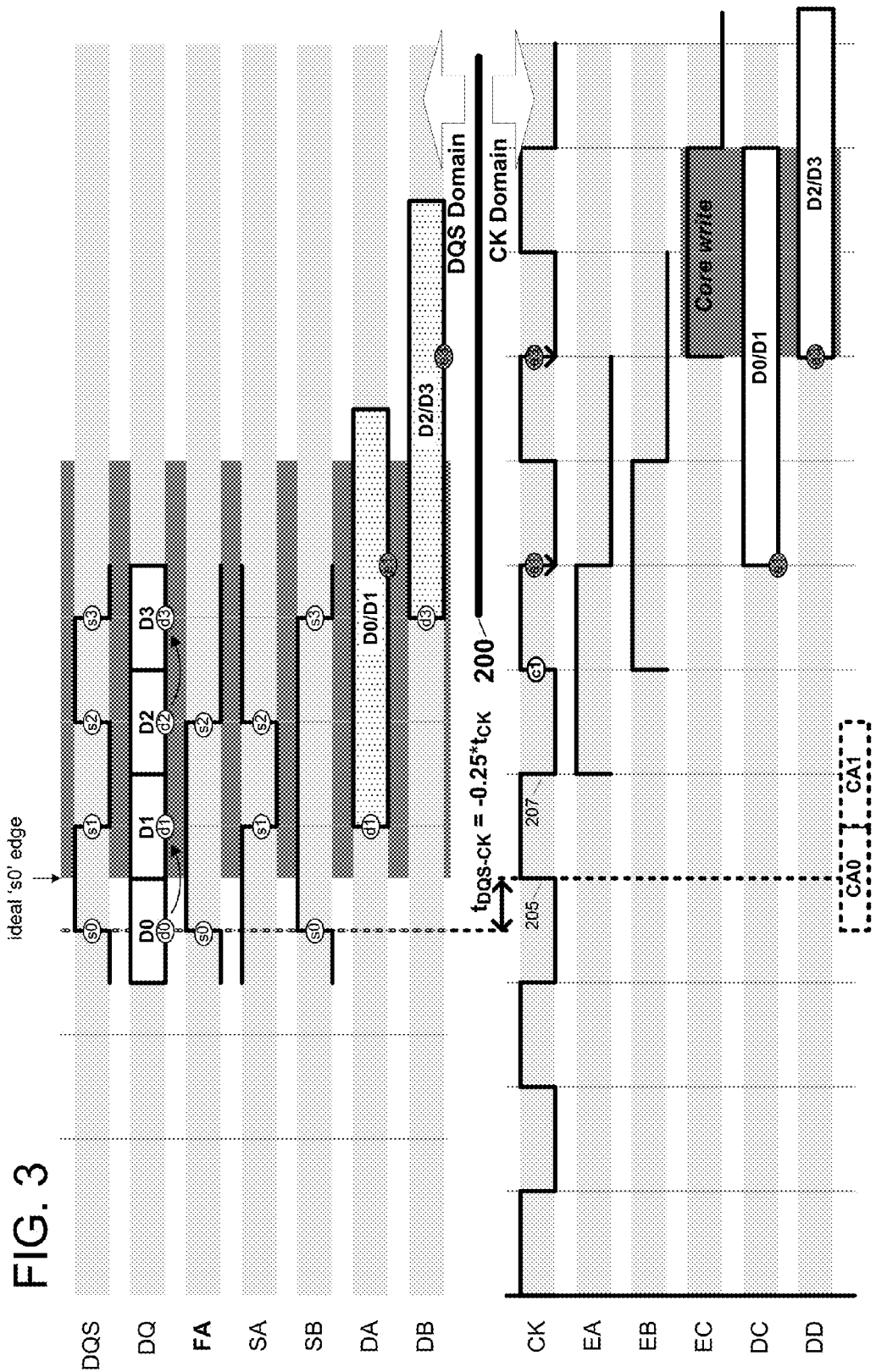
FIG. 3 is an exemplary timing diagram of the operation of the signal reception and domain crossing operations described in reference to FIG. 1 when the strobed clock domain leads the clocked timing domain by a quarter clock cycle.

Referring specifically to FIG. 2, the free-running clock signal (CK) samples the command portion (CA0) of incoming command/address value at rising edge 205 to mark the nominal start of a memory access operation, in this case a write operation. A half clock cycle later, the address portion of the command/address value is sampled in response to falling clock edge 207, though, as discussed above, a single-rate command transfer may be effected in alternative embodiments and the two portions of the write command may each include a mix of command and address bits.

As described above, the command portion of the command/address value is decoded following clock edge 205 to enable assertion of a corresponding enable signal, in this case a write-enable signal which yields a write-enable pulse ("EA" which is also designated "WR" in the embodiment of FIG. 1), when registered in response to falling clock edge 207. Delayed write-enable pulse, EB, is asserted a half clock cycle later in response to clock edge "c1," and yields core write-enable pulse EC a cycle and a half later. As explained above, the assertion and ensuing deassertion of the write-enable pulse, EB, enables DA and DB signals output from the strobe domain to be loaded into core domain registers (i.e., sampled by registers 175 and 177 of FIG. 1) at falling clock edges "e1" and "e3," thus effecting a strobe-to-clock domain crossing and presenting data words D0/D1 and D2/D3 at the core interface when the core write-enable pulse goes high. Accordingly, the leading edge of write-enable pulse EB is referred to herein as the "domain load-enable" signal (DLE) and falling clock edges e1 and e3 are referred to herein as the clock domain load edges. In embodiments discussed below, the domain-load enable signal is selectively advanced or delayed to adjust (reduce) the strobe-to-clock domain skew.

Referring now to the strobe-domain signals shown in FIG. 2, the incoming strobe signal (DQS) transitions once for each of the four incoming bytes of incoming write data as shown at s0-s3, thus cycling once for each pair of incoming write data bytes (D0/D1 and D2/D3). As shown, application of the half-rate replica signal, FA, to logic gates 155 and 157 yields respective (separate) word-load signals, SA and SB, for the two write data byte pairs, with each word-load signal having only one falling-edge transition for every two falling edges of the strobe signal. By this operation, instead of loading byte pairs into a shared register one after another (e.g., in response to successive falling edges of the strobe signal), the byte pairs (each of which constitutes a 16-bit "word") are loaded into separate strobe-domain registers (163 and 165) and held there for twice as long as under a conventional approach. By this operation, the time that each byte pair is presented at the strobe-to-clock domain crossing (i.e., the data valid interval) is increased from one clock cycle to two. Accordingly, in an embodiment that requires at least a quarter-cycle of margin (i.e., half a bit time or "unit interval" where double-data-rate signaling is employed) to ensure reliable domain crossing, the skew tolerance is increased by an entire clock cycle and thus from ±0.25$T_{CK}$ (i.e., assuming that the domain-crossing load signal is asserted at the dead center of the one-cycle valid interval available in conventional approaches, then the strobe-to-clock skew ($t_{DQS-CK}$) is limited to ±0.25) to ±0.75$T_{CK}$; a 300% increase in the example presented. The cost of this substantially increased skew tolerance, which includes the additional logic needed to generate the replica and word-load signals, the additional word buffer (e.g., 165), and the double-width domain crossing path (i.e., 32 lines instead of 16 in the example shown), is generally negligible in comparison with the value of the substantially broadened range of system and IC designs that become possible.

Still referring to FIG. 2, it can be seen that the rising edge ("c1") of delayed write-enable pulse, EB, occurs one clock cycle after the nominal "ideal" timing of the initial strobe edge, "s0" and thus yields clock domain load edges "e1" and "e3" at $s0_{ideal}$+1.5$T_{CK}$ and $s0_{ideal}$+2.5$T_{CK}$, respectively. Because of the extended valid interval of the write data byte pairs DA and DB output from the strobe domain, however, the two ensuing falling edges of the clock signal (i.e., "e1" and "e3," the clock-domain load edges) sample valid strobe domain byte pairs with a quarter $T_{CK}$ margin, despite the −0.75$T_{CK}$ skew between the strobe and clock domains. FIG.

Figure 4:
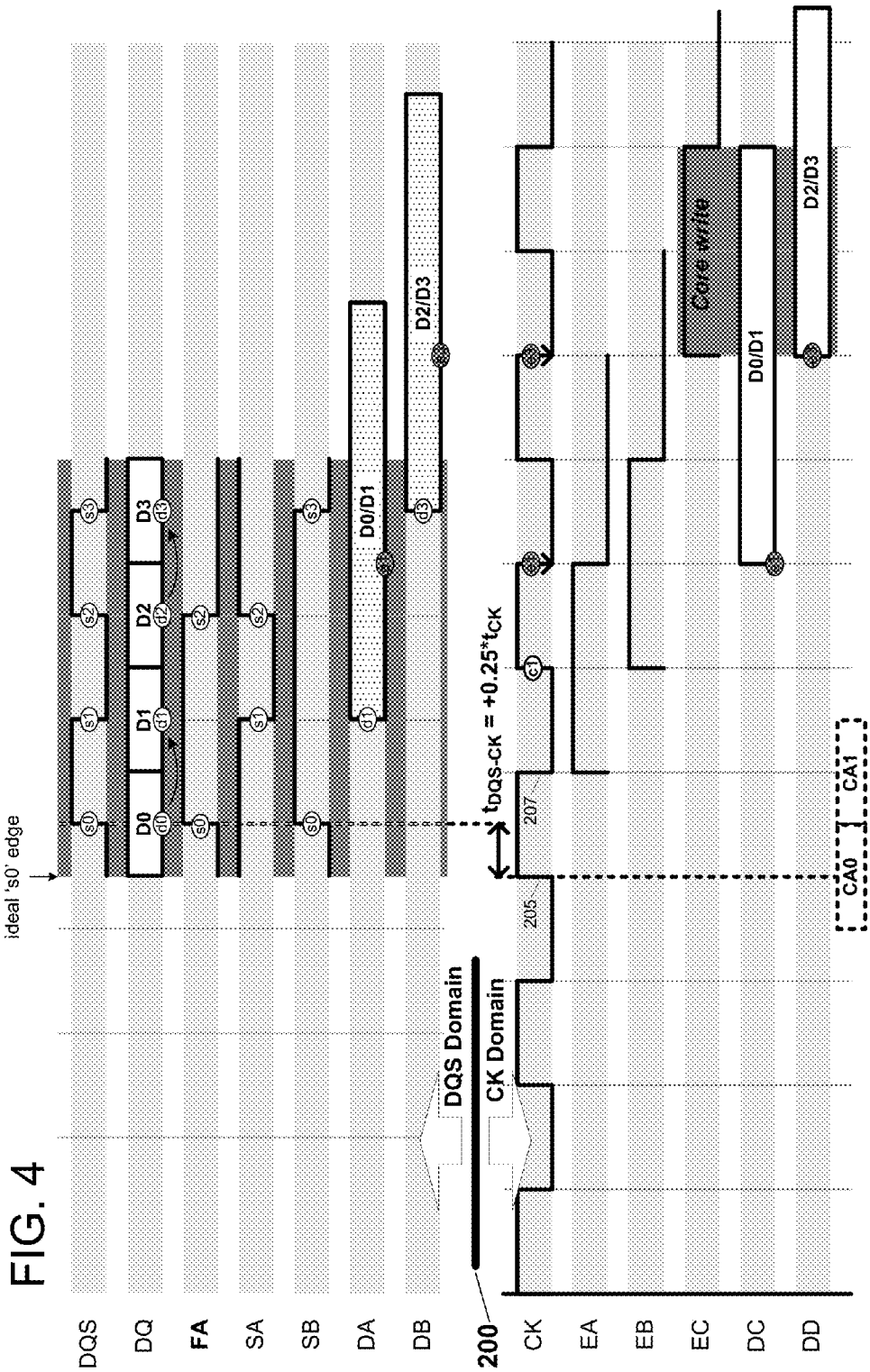
FIG. 4 is an exemplary timing diagram of the operation of the signal reception and domain crossing operations described in reference to FIG. 1 when the strobed clock domain lags the clocked timing domain by a quarter clock cycle.
Figure 5:
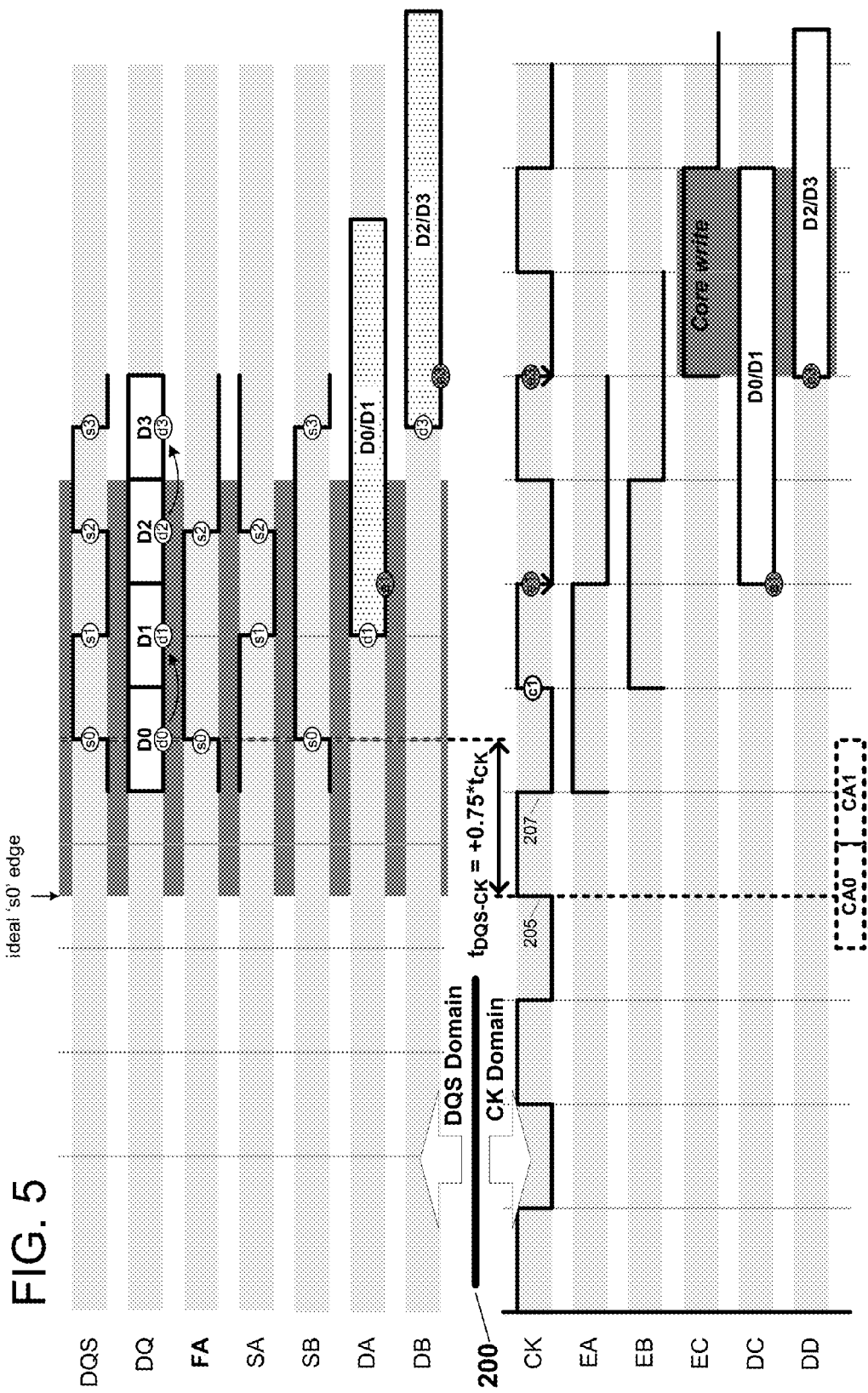
FIG. 5 is an exemplary timing diagram of the operation of the signal reception and domain crossing operations described in reference to FIG. 1 when the strobed clock domain lags the clocked timing domain by three quarters of a clock cycle.

3 illustrates a $-0.25T_{CK}$ domain skew example (i.e., strobe domain leads the clock domain by a quarter clock cycle), showing that the clock domain load edges are relatively centered within the extended-interval byte pairs (DA and DB) output from the strobe domain, thus effecting the strobe-to-clock domain crossing with plenty of margin (i.e., $0.75T_{CK}$ in the example shown). Similarly, FIG. 4 illustrates a $+0.25T_{CK}$ skew example (i.e., strobe domain lags the clock domain by a quarter clock cycle), showing that the clock domain edges are, again, relatively centered within the extended-interval byte pairs output from the strobe domain, so that the domain crossing occurs with margin to spare (i.e., $0.75T_{CK}$). FIG. 5 illustrates a $+0.75T_{CK}$ domain skew example (i.e., strobe domain lags the clock domain by three-quarters of a clock cycle), showing that that the clock domain load edges sample valid strobe domain byte pairs with a quarter $T_{CK}$ margin, despite the large (i.e., $0.75T_{CK}$) skew between the strobe and clock domains. Accordingly, by generating a reduced-rate replica of the strobe signal (i.e., a frequency-divided strobe signal) and applying the replica signal to load separate strobe-domain output buffers at a reduced rate, the overall time available to sample the strobe-domain output, and thus the skew tolerance of the strobe-to-clock domain crossing, is significantly increased.

Note that the clock-domain registers 175 and 177 hold the incoming four write-data bytes stable while they are being written to the memory core. Although this core write interval is shown as having a duration of one clock cycle ($T_{CK}$) in the timing waveforms of FIGS. 2-5, the core write interval may be increased to two clock cycles by adding another 16-bit register clocked by CK between register 175 and the "DC" input to memory core 115. This would have the effect of delaying the data valid window of the D0/D1 write data bytes to align with the D2/D3 data-valid window. Such an approach, which beneficially increases the timing margin (or timing budget) for the core write operation at the cost of increasing the write latency, may also be applied in other embodiments described herein (e.g., in the embodiment of FIG. 6, described below).

Reflecting on the $±0.99T_{CK}$ domain skew tolerance achieved within the memory component of FIG. 1 and considering that the net tolerance exceeds a clock cycle, it can be seen that a relatively low-margin $-0.75T_{CK}$ skew condition may be converted to a higher-margin $+0.25T_{CK}$ skew condition by advancing the clock domain load operation by a clock cycle, and thus by advancing the write-enable pulse, EB, by a clock cycle. Similarly, the low-margin $+0.75T_{CK}$ skew condition may be converted to the higher-margin $-0.25T_{CK}$ skew condition by delaying (or retarding) the clock domain load operation by a clock cycle and thus by delaying write-enable pulse, EB, by a clock cycle. From these insights, it follows that, by detecting when the domain skew exceeds a half clock cycle (e.g., skew is $-0.75T_{CK}$ or $+0.75T_{CK}$), and then advancing or delaying the EB (delayed write-enable) pulse by a clock cycle to bring the domain skew back within a half clock cycle, the permissible domain skew tolerance may be virtually unlimited (e.g., ranging ±many clock cycles). Moreover, while the skew detection need be executed only once to learn the static domain skew within a given signaling system, the skew detection may also be performed on an ongoing basis to compensate for environmentally induced drift in the strobe-to-clock domain skew (e.g., skew increase/decrease due to temperature and/or voltage changes).

Figure 6:
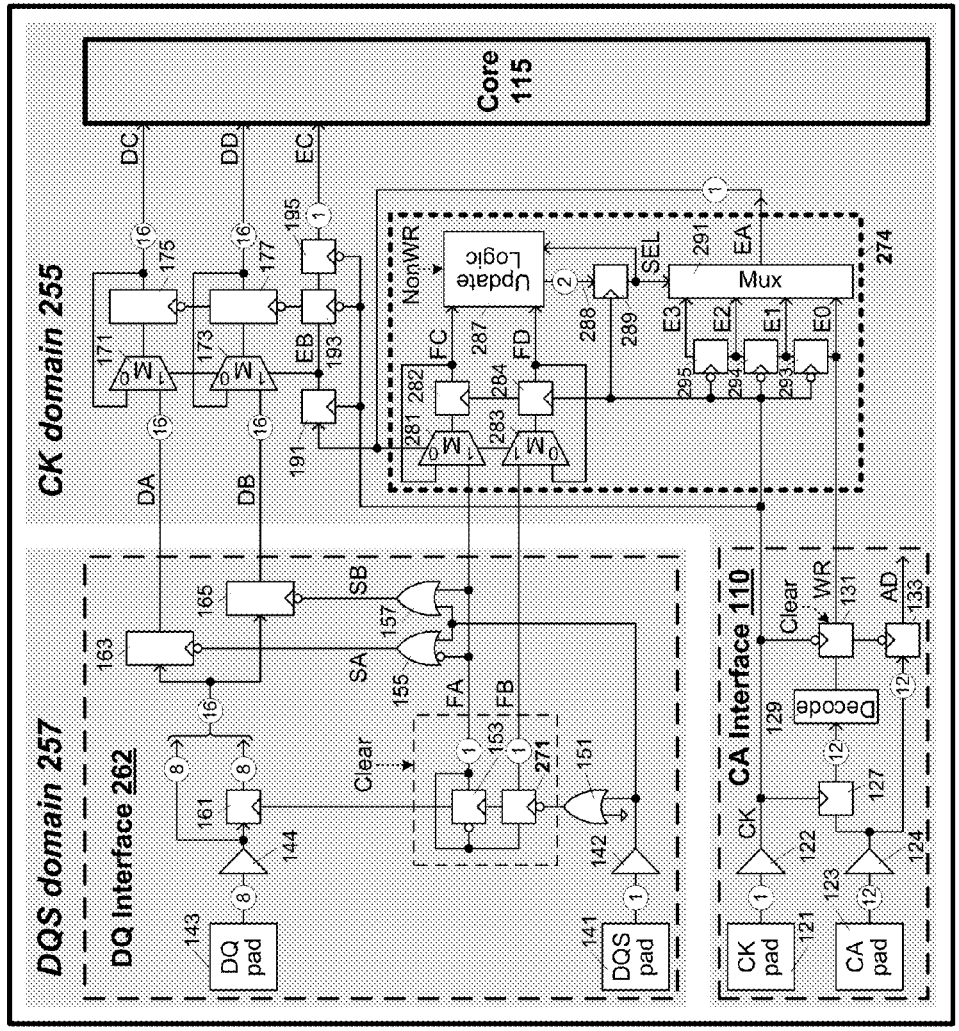
FIG. 6 illustrates an alternative embodiment of a skew-tolerant memory component that may be deployed within the memory system of FIG. 1.
Figure 7:
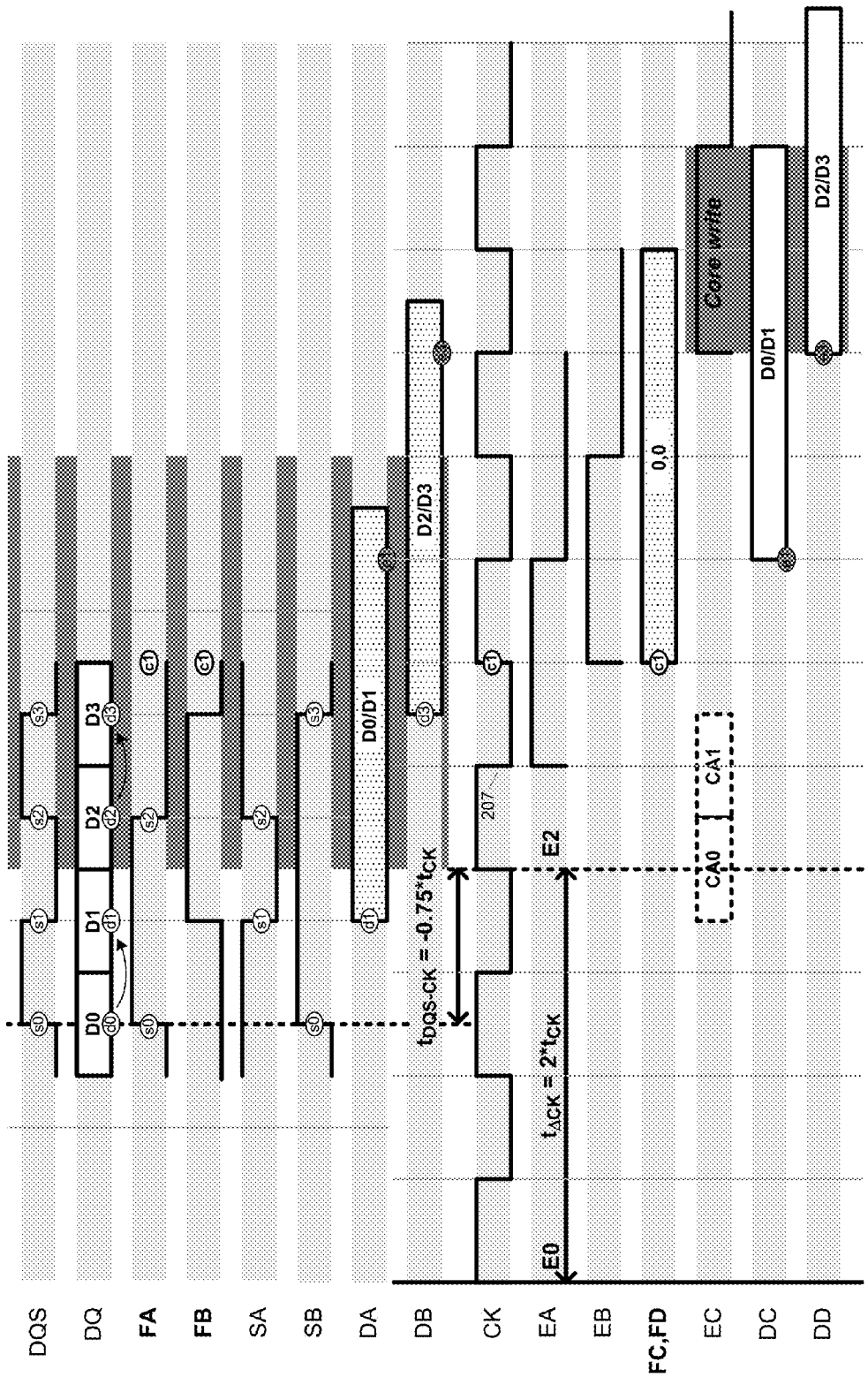
FIG. 7 is an exemplary timing diagram of operation within the memory component of FIG. 6 when the strobed clock domain leads the clocked timing domain by three quarters of a clock cycle.
Figure 8:
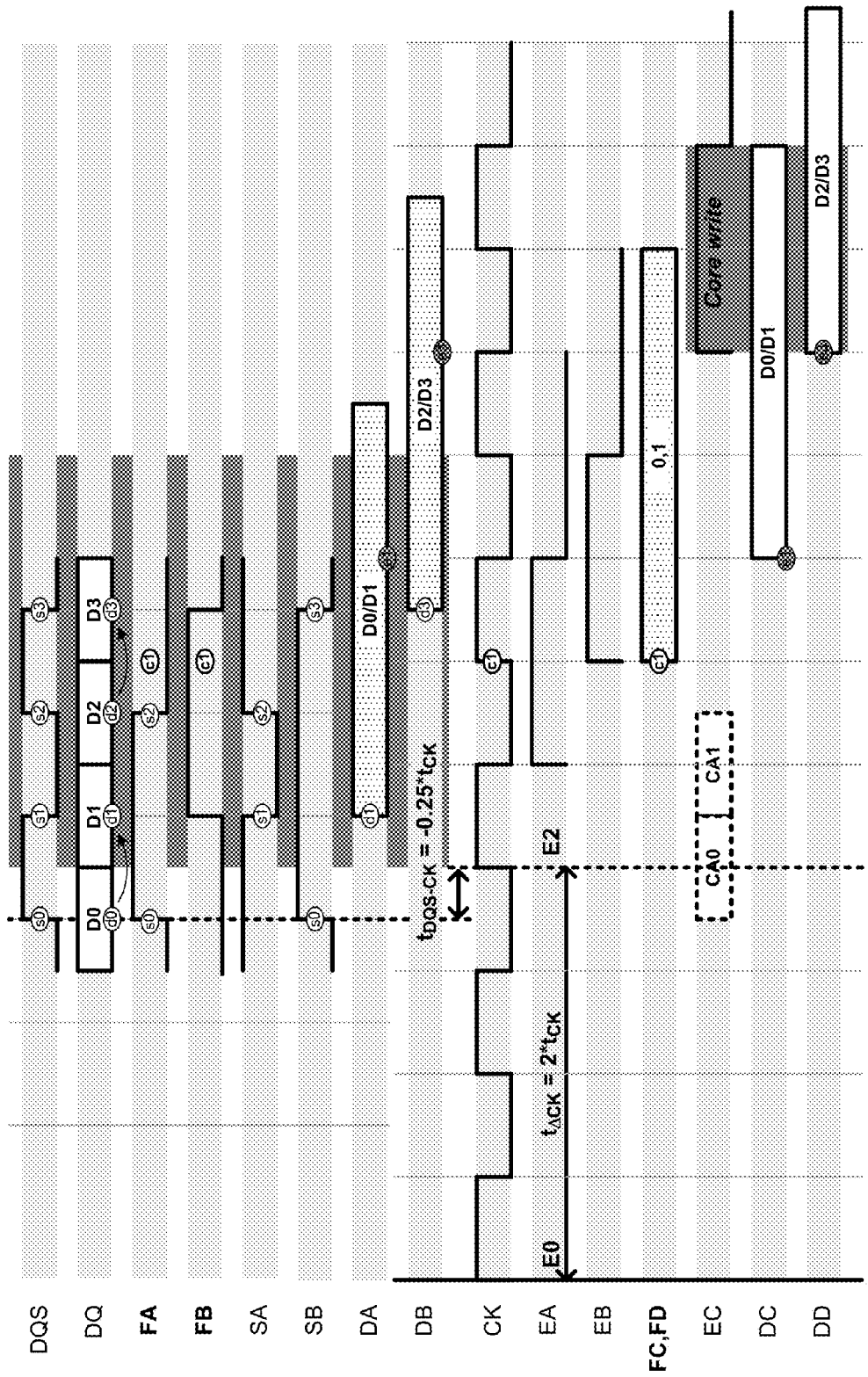
FIG. 8 is an exemplary timing diagram of operation within the memory component of FIG. 6 when the strobed clock domain leads the clocked timing domain by a quarter clock cycle.
Figure 9:
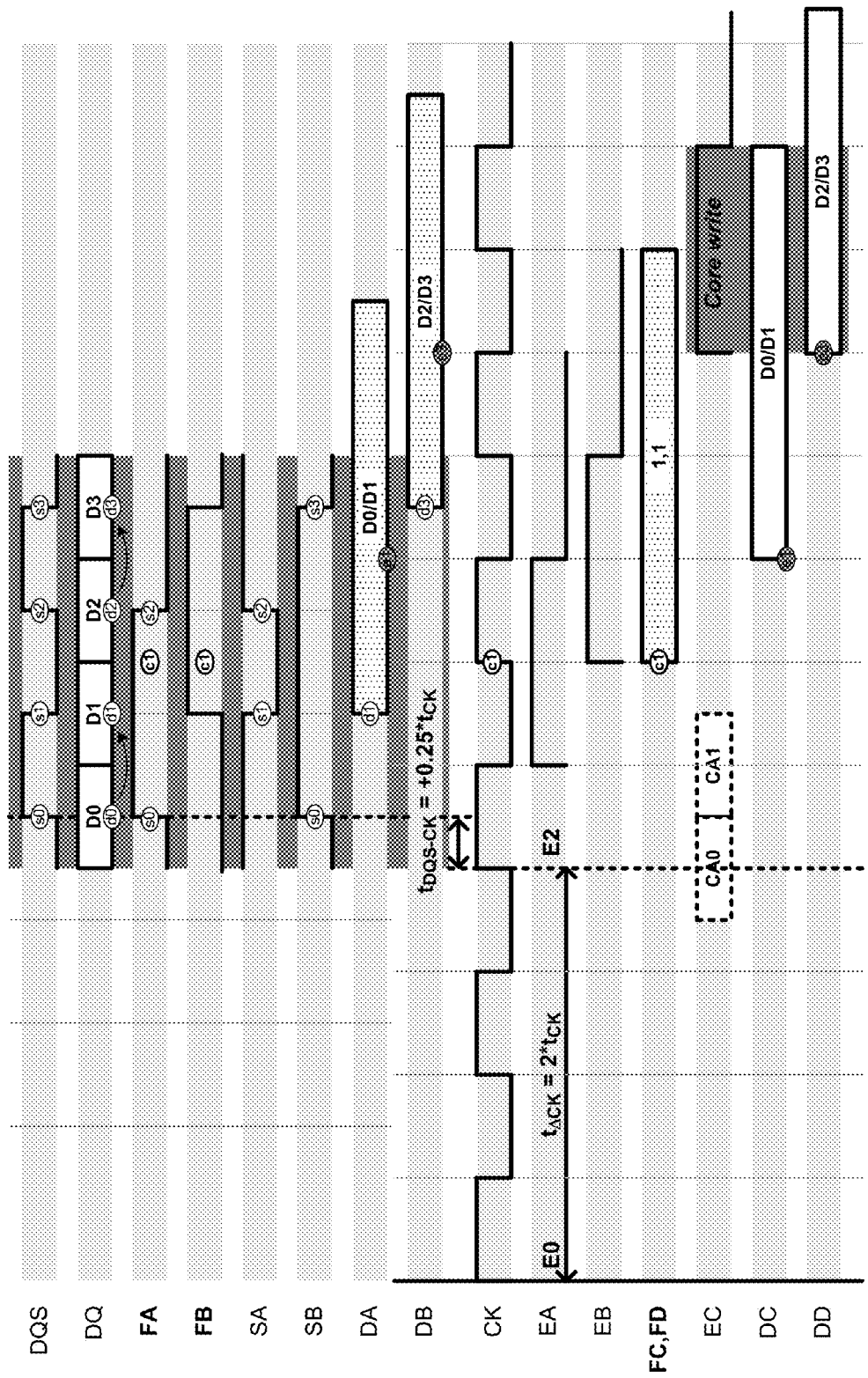
FIG. 9 is an exemplary timing diagram of operation within the memory component of FIG. 6 when the strobed clock domain lags the clocked timing domain by a quarter clock cycle.
Figure 10:
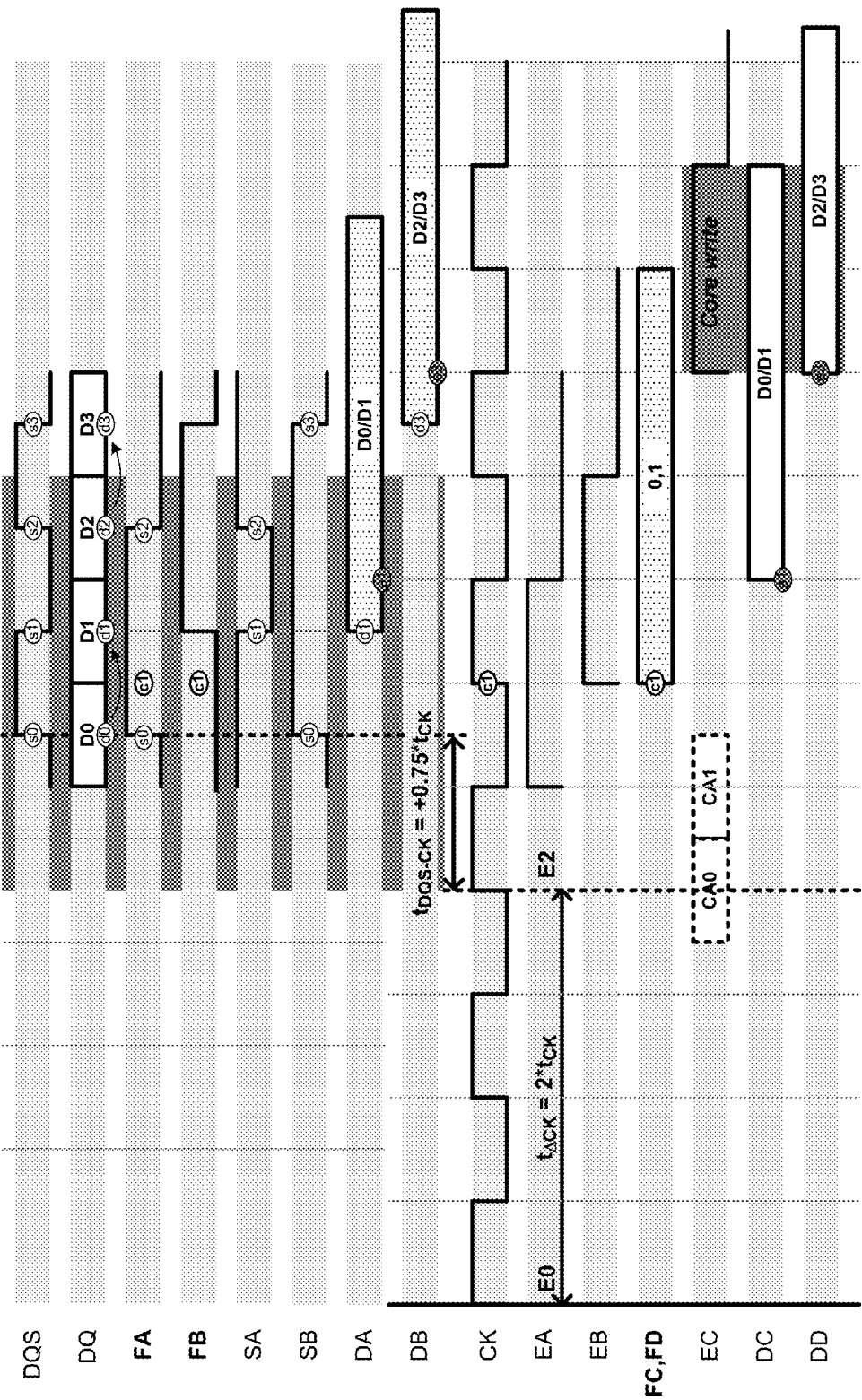
FIG. 10 is an exemplary timing diagram of operation within the memory component of FIG. 6 when the strobed clock domain lags the clocked timing domain by three quarters of a clock cycle.

FIG. 6 illustrates another embodiment of a skew-tolerant memory component 250 that may be deployed within the memory system of FIG. 1. Broadly speaking, the signaling interfaces and domain crossing logic are implemented generally as described in reference to FIG. 1, but supplemented by logic within the strobe domain (257) that enables a coarse measure of the strobe-to-clock domain skew to be detected, and by logic within the clock domain (255) to advance or delay the delayed write-enable pulse, EB, according to the coarse skew measure. More specifically, instead of generating a single reduced-rate strobe replica signal, negative-strobe-edge-triggered toggle-flop 271 is provided within data interface 262 to produce an additional, reduced-rate strobe replica signal, FB, having a quadrature phase relationship to replica signal, FA. By sampling the quadrature replica signals following assertion of selectively delayed write-enable pulse, EA (a one-cycle-advanced instance of the delayed write-enable pulse, EB), one of four coarse measures of the strobe-to-clock domain skew may be obtained. Referring to FIGS. 7-10, for example, each of which illustrates the same skew condition as FIGS. 2-5, respectively (i.e., $-0.75T_{CK}$, $-0.25T_{CK}$, $+0.25T_{CK}$ and $+0.75T_{CK}$), together with the additional replica signal (FB) and clock-domain replica samples (FC and FD), assertion of delayed write-enable signal EA at falling clock edge 207 enables the FA and FB signals to pass through multiplexers 281 and 282 and be sampled by registers 282 and 284, respectively, in response to clock edge c1, thus capturing a '00' "skew code" in replica samples FC and FD. Executing this same replica-signal sampling operation in the $-0.25T_{CK}$, $+0.25T_{CK}$ and $+0.75T_{CK}$ skew conditions, yields skew codes (i.e., values of FC,FD) of '01', '11', and '10', respectively; codes that change by one bit state as the strobe-to-clock domain skew progresses through the four skew conditions shown.

Still referring to FIG. 6 and the corresponding timing diagrams 7-10, the skew code sampled in response to clock edge c1 is provided to update logic 287 which determines if one of the large (low-margin) strobe-to-clock domain skew conditions exists (i.e., skew magnitude of $0.5T_{CK}$ or more). If a low-margin domain skew condition is detected (i.e., FC/FD=00 or FC/FD=10), update logic 287 decrements or increments a selector value 288 used to select the clock edge that triggers the domain load enable pulse (i.e., EA and thus EB), thereby advancing or delaying the domain loading operation by a clock cycle and thus realigning the strobe and clock domains at the lower-skew (higher-margin)+$0.25T_{CK}$ or $-0.25T_{CK}$ skew conditions. In the embodiment shown, selector value 288 is a two-bit count value that is captured within skew-state register 289 and output therefrom as a domain selector (SEL) to the control input of a write-enable multiplexer 291. Write-enable multiplexer 291 responds to the domain selector (SEL) by selecting one of four progressively delayed write-enable pulses, E0, E1, E2 or E3 output from a shift register formed by flop stages 131, 293, 294 and 295. Thus, assuming that update logic 287 is initialized to select signal, E2, to be forwarded as the delayed write-enable pulse, but subsequently receives a skew code indicating that the strobe domain leads the clock domain by more than $0.5T_{CK}$ (i.e., skew code '00' nominally indicating the $-0.75T_{CK}$ skew condition), update logic 287 responds by decrementing the domain selector value and thus selecting signal E1 to source the delayed write-enable pulse instead of E2. This adjustment effectively reduces number of stages in the shift register (or queue) that produces domain load enable signal (i.e., delayed write-enable pulse), EB, thereby advancing the clock domain load operation by a clock cycle so that the strobe-to-domain clock skew is restored to a higher margin condition (i.e., shifting from $-0.75T_{CK}$ to $+0.25T_{CK}$). If the strobe domain continues to drift in a leading direction relative to the clock domain such that a '00' skew code is detected again, update logic 287 will again decrement the domain selector (SEL) to select signal EU to source the delayed write-enable pulse instead of E1, thereby advancing the domain load operation by another clock cycle and again restoring the domain skew to the conservative condition. Conversely, if the domain skew drifts in the opposite direction and is determined to lag the clock domain by more than $0.5T_{CK}$ (i.e., skew code '10' nominally indicating the +$0.75T_{CK}$ skew condition), update logic 287 responds by incrementing the domain selector value (thus selecting a clock-cycle-delayed write-enable pulse) to delay the domain load operation by a clock cycle and thereby restore the domain skew to a more conservative condition. Note that while a total of four cycle-staggered signals (E0-E3) may be selected to source the delayed write-enable pulse in the embodiment of FIG. 6, more or fewer cycle-staggered signals may be provided to and selected by multiplexer 291 in alternative embodiments, thus enabling virtually unlimited skew tolerance. Also, after incrementing or decrementing the domain selector value, update logic 287 may optionally insert or enforce a delay interval before incrementing or decrementing the domain selector again. This hysteresis avoids dithering of the domain selector in cases where the strobe-to-clock skew ($t_{DQS-CK}$) settles near the +$0.50T_{CK}$ or −$0.50T_{CK}$ skew point.

In the embodiment shown in FIG. 6, update logic 287 is implemented by combinatorial logic that adjusts its output according to the incoming skew code and the present state of the domain selector (i.e., the domain selector (SEL) is fed back to the update logic as shown). In one implementation, for example, update logic 287 continues to increment or decrement the domain selector in response to incoming skew codes until the domain selector reaches a minimum or maximum value. Also, the update logic, if fast enough, may be enabled to sample the skew code and shift the domain load point (i.e., advance or delay the domain load enable signal) during each memory write operation. Alternatively, because the strobe and clock domains may drift relatively slowly, the update logic may be enabled to sample the incoming skew code only during specific skew-control operations carried out, for example, concurrently with memory refresh and/or other maintenance operations. In one implementation, for example, a memory controller or other control component is designed to cycle the data strobe signal as shown in FIG. 6 in association with transmission of a refresh command (or other maintenance command) to enable a domain skew-adjustment, even though no data (or at least no valid data) is transmitted. More specifically, in the context of FIG. 6, a "non-write" signal may be output from decoder 129 to update logic 287 (registered as necessary to avoid asynchronous race conditions) which, in turn, updates the domain selector (SEL) based on the incoming replica signal samples, FC/FD. In such an embodiment, the non-write signal may be used to control the operation of multiplexers 281 and 283 instead of write-enable pulse EA, thereby enabling the replica samples to be captured.

Figure 11:
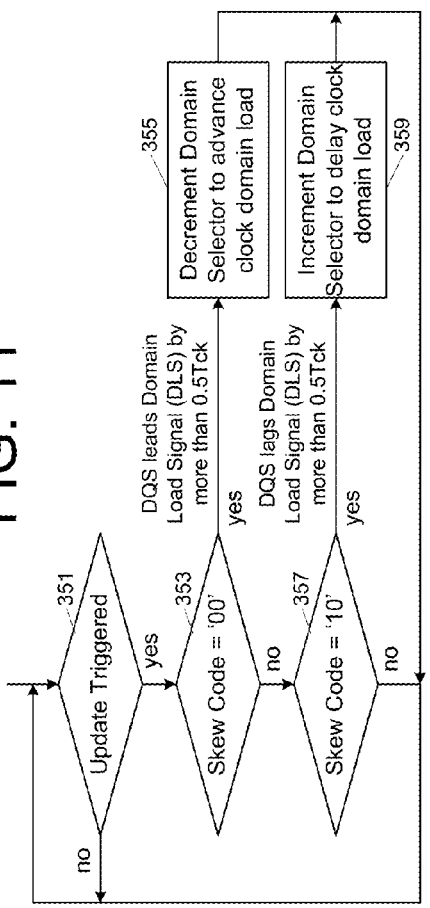
FIG. 11 is a flow diagram illustrating an exemplary operation of the update logic shown in FIG. 6.

FIG. 11 is a flow diagram illustrating an exemplary operation of the update logic shown in FIG. 6. At 351, the update logic determines whether an update has been triggered, for example by detecting assertion of a control signal (e.g., assertion of "non-write" signal or skew-update signal) or by determining that the incoming skew code does not match a previously recorded code. In the latter case, the update logic may be implemented by a state machine that is clocked, for example, by the incoming clock signal. If an update is triggered (affirmative determination at 351), the update logic evaluates the incoming skew code at 353 to determine whether the strobe domain leads the clock domain by more than a predetermined fraction of a clock cycle (e.g., $0.5T_{CK}$ as in the FIG. 6). If such a low-margin condition exists (e.g., as indicated by skew code '00' in the embodiment of FIG. 6), the update logic decrements the domain selector at 355, thereby advancing the domain load enable signal and restoring the skew to a low margin condition. If the strobe domain is determined not to lead the clock domain by more than a predetermined fraction of a clock cycle (i.e., negative determination at 353), the update logic evaluates the skew code at 357 to determine whether the strobe domain lags the clock domain by more than predetermined fraction of a clock cycle. Again, if such a low-margin condition exists (e.g., as indicated by skew code '10' in the embodiment of FIG. 6), the update logic increments the domain selector at 359, thereby delaying the domain load enable signal and restoring the domain skew to a low margin condition.

Figure 12:
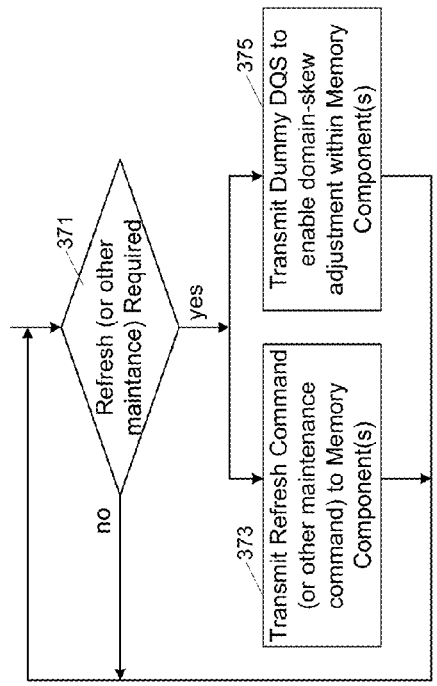
FIG. 12 illustrates an exemplary sequence of operations that may be executed by logic within the controller component of FIG. 1 to initiate a domain-skew adjustment operation within one or more attached memory components.

FIG. 12 illustrates an exemplary sequence of operations that may be executed by logic within the controller component of FIG. 1 to initiate a domain-skew adjustment operation within one or more attached memory components. In the implementation shown, the controller determines whether a refresh operation is required at 371 and, if so, transmits the refresh command (or other maintenance command) to the attached memory components at 373, and also transmits a dummy strobe signal (e.g., cycling the strobe signal twice to emulate the transmission of valid write data) to the memory components at 375 to enable the memory components to obtain a coarse measure of the strobe-to-clock domain skew (e.g., by generating and sampling strobe replica signals), and thus perform a domain skew adjustment. By transmitting the dummy strobe signal in conjunction with the refresh operation, the domain skew adjustment is effectively hidden under the refresh operation (i.e., produces no interruption in memory utility beyond that already incurred by the refresh operation itself) and is executed frequently enough to track environmentally induced drift in the strobe-to-clock skew.

While the domain skew adjustments described above have been presented in the context of write-data receipt within a memory component, it should be noted that substantially the same approach may be used to establish skew-tolerant domain crossing within the control component. That is, read data transmitted by a memory component may be sampled within a control component in response to an accompanying strobe signal, thus establishing a strobed timing domain within the control component. By generating a reduced-frequency replica signal corresponding to the incoming strobe signal (e.g., before or after such strobe signal is shifted to achieve quadrature alignment with respect to incoming read data) and applying the replica signal to extend the interval over which the incoming read data is presented to a clocked domain within the control component, significant additional domain crossing margin may be obtained, thus correspondingly increasing tolerance to strobed-to-clocked domain skew. Further, by obtaining a coarse measure of the domain skew (e.g., by generating and sampling quadrature versions of reduced-rate strobe replica signals), and using that skew measurement to detect low margin conditions, the domain skew may be responsively adjusted to higher margin skew conditions within the control component using techniques and embodiments generally as described above. In yet other embodiments of control components and/or memory components, the need for initializing the state of the replica signal generators or other circuitry relating to the domain crossing operation may be avoided, for example by providing circuitry to discern the state of the replica signals with respect to incoming data.

Although only one memory device 103 is shown in system of FIG. 1, multiple memory devices 103 may be coupled to controller 101 in various interconnection topologies. In one embodiment, for example, multiple memory devices 103 are disposed on a memory module (i.e., substrate designed to be removably inserted into a memory module connector and having on-board wiring to couple the command and clock paths in common to all the memory devices disposed on the substrate and to couple respective, dedicated data paths (or respective portions of an otherwise unified data path) to the memory devices). The host system itself, which may be virtually any system having a memory function, may have one or more module connectors with, for example, a given data path being coupled to one memory device (or two or memory devices where a memory module has separately selectable sets or ranks of memory devices) on each memory module. Also, in a "multi-channel" embodiment, a separate and distinct memory access channel may be provided for each set of memory devices (with each memory device set being disposed, for example, on a respective memory module or in a respective integrated-circuit package). Further, the memory-side interface to the controller component and control-side interface to memory components (including the skew-tolerant domain crossing arrangements described above) may be implemented in a buffer IC, itself having a set of wider/slower or faster/narrower interfaces to respective memory devices. The buffer IC may be, for example, disposed on a memory module together with the memory devices coupled thereto, or socketed or otherwise disposed on a motherboard along with the IC containing the memory controller.

It should be noted that the various circuits disclosed herein can be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions can be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions can be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific numbers of bits, signal path widths, signaling or operating frequencies, component circuits or devices and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. Signals and signaling links, however shown or described, can be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied, at least where practicable, in combination with any other of the embodiments or in place of counterpart features or aspects thereof. Accordingly, the specification and drawings are to be regarded in an illustrative rather than a restrictive sense.

What is claimed is:

1. An integrated circuit device comprising:
   a strobed signaling interface to receive a sequence of data values at respective times indicated by transitions of a strobe signal; and
   circuitry to generate a first reduced-frequency version of the strobe signal and to store, at times indicated at least in part by the first reduced-frequency version of the strobe signal, respective subsets of the data values for respective durations that are longer than an interval over which any one of the subsets of the data values is valid at the strobed signaling interface.

2. The integrated circuit device of claim 1 further comprising a core interface that is clocked by a clock signal having an arbitrary skew relative to the strobe signal, the core interface comprising circuitry to sample each of the stored subsets of the data values stored in response to a respective transition of the clock signal.

3. The integrated circuit device of claim 1 wherein the circuitry to generate the first reduced-frequency version of the strobe signal comprises circuitry to generate a plurality of sampling signals, each of which comprises fewer transitions than the strobe signal over an interval in which the sequence of data values is valid at the strobed signaling interface.

4. The integrated circuit device of claim 3 wherein the circuitry to store respective subsets of the data values for respective durations comprises a plurality of storage elements each to store a respective one of the subsets of the data values in response to a transition of a corresponding one of the plurality of sampling signals.

5. The integrated circuit device of claim 1 wherein the circuitry to generate the first reduced-frequency version of the strobe signal comprises:
   a storage element that changes state in response to transitions of the strobe signal to produce, as the reduced-frequency version of the strobe signal, a version of the strobe signal that transitions once for each two transitions of the strobe signal; and
   logic to reset the storage element to a predetermined state prior to receiving the sequence of data values.

6. The integrated circuit device of claim 1 wherein the circuitry to generate the first reduced-frequency version of the strobe signal comprises circuitry to generate a second reduced-frequency version of the strobe signal having a quadrature phase relationship to the first reduced-frequency version of the strobe signal.

7. The integrated circuit device of claim 6 further comprising skew adjustment logic to selectively adjust, based at least in part on the first and second reduced-frequency versions of the strobe signal, a time at which one of the subsets of the data values is transferred to a timing domain clocked by a clock signal having an arbitrary skew relative to the strobe signal.

8. The integrated circuit device of claim 7 wherein the skew adjustment logic to selectively adjust the time at which the one of the subsets of the data values is transferred to the timing domain clocked by the clock signal comprises:
   circuitry to sample the states of the first and second reduced-frequency versions of the strobe signal in response to a transition of the clock signal to determine a skew between the timing domain clocked by the clock signal and a timing domain defined by the transitions of the strobe signal; and
   circuitry to adjust the time at which the one of the respective subsets of the data values is transferred to the timing domain clocked by the clock signal if the skew between the timing domain clocked by the clock signal and the timing domain defined by the transitions of the strobe signal exceeds a predetermined threshold.

9. The integrated circuit device of claim 7 wherein the skew adjustment logic to selectively adjust the time at which the one of the subsets of the data values is transferred to the timing domain clocked by a clock signal comprises circuitry to advance or delay, by a period of the clock signal, the time at which the one of the subsets of the data values is transferred to the timing domain clocked by the clock signal.

10. The integrated circuit device of claim 1 further comprising a memory array to store the sequence of data values.

11. A method of operation within an integrated circuit device, the method comprising:
   receiving a sequence of data values at respective times indicated by transitions of a strobe signal;
   generating a first reduced-frequency version of the strobe signal; and
   storing, at times indicated at least in part by the first reduced-frequency version of the strobe signal, respective subsets of the data values for respective durations that are longer than an interval over which any one of the subsets of the data values is valid at the strobed signaling interface.

12. The method of claim 11 further comprising transferring each of the stored subsets of the data values to a clock timing domain of the integrated circuit device in response to a respective transition of a clock signal.

13. The method of claim 11 further comprising generating a plurality of sampling signals, each of which comprises fewer transitions than the strobe signal over an interval in which the sequence of data values is valid at the strobed signaling interface.

14. The method of claim 13 wherein storing the subsets of the data values for respective durations comprises storing each of the subsets of the data values within a respective one of a plurality of storage elements in response to a transition of a corresponding one of the plurality of sampling signals.

15. The method of claim 11 wherein generating the first reduced-frequency version of the strobe signal comprises:
   generating a first version of the strobe signal that transitions once for each two transitions of the strobe signal; and
   resetting a storage element used to generate the first reduced-frequency version of the strobe signal to a predetermined state prior to receiving the sequence of data values.

16. The method of claim 11 further comprising generating a second reduced-frequency version of the strobe signal having a quadrature phase relationship to the first reduced-frequency version of the strobe signal.

17. The method of claim 16 further comprising selectively adjusting, based at least in part on the first and second reduced-frequency versions of the strobe signal, a time at which one of the subsets of the data values is transferred to a timing domain clocked by a clock signal having an arbitrary skew relative to the strobe signal.

18. The method of claim 17 wherein selectively adjusting the time at which the one of the subsets of the data values is transferred to the timing domain clocked by the clock signal comprises:
   sampling the states of the first and second reduced-frequency versions of the strobe signal in response to a transition of the clock signal to determine a skew between the timing domain clocked by the clock signal and a timing domain defined by the transitions of the strobe signal; and
   adjusting the time at which the one of the respective subsets of the data values is transferred to the timing domain clocked by the clock signal if the skew between the timing domain clocked by the clock signal and the timing domain defined by the transitions of the strobe signal exceeds a predetermined threshold.

19. The method of claim 17 wherein selectively adjusting the time at which the one of the subsets of the data values is transferred to the timing domain clocked by a clock signal comprises advancing or delaying, by a period of the clock signal, the time at which the one of the subsets of the data values is transferred to the timing domain clocked by the clock signal.

20. An integrated circuit device comprising:
   means for receiving a sequence of data values at respective times indicated by transitions of a strobe signal;
   means for generating a first reduced-frequency version of the strobe signal; and
   means for storing, at times indicated at least in part by the first reduced-frequency version of the strobe signal, respective subsets of the data values for respective durations that are longer than an interval over which any one of the subsets of the data values is valid at the strobed signaling interface.

* * * * *